(12) United States Patent
Mohanty et al.

(10) Patent No.: US 11,239,825 B1
(45) Date of Patent: Feb. 1, 2022

(54) MICROMECHANICAL DEVICE AND RELATED METHODS

(71) Applicant: FemtoDx, Inc., Beverly Hills, CA (US)

(72) Inventors: Pritiraj Mohanty, Beverly Hills, CA (US); Shyamsunder Erramilli, Quincy, MA (US)

(73) Assignee: FemtoDx, Inc., Beverly Hills, CA (US)

( * ) Notice: Subject to any disclaimer, the term of this patent is extended or adjusted under 35 U.S.C. 154(b) by 0 days.

(21) Appl. No.: 16/109,082

(22) Filed: Aug. 22, 2018

Related U.S. Application Data

(60) Provisional application No. 62/548,665, filed on Aug. 22, 2017.

(51) Int. Cl.
*H04R 9/00* (2006.01)
*H03H 9/24* (2006.01)
*H03H 9/46* (2006.01)
*H03H 9/02* (2006.01)

(52) U.S. Cl.
CPC ...... *H03H 9/2405* (2013.01); *H03H 9/02448* (2013.01); *H03H 9/462* (2013.01)

(58) Field of Classification Search
CPC ... H04R 17/00; H04R 17/02; H04R 2201/003
See application file for complete search history.

(56) References Cited

U.S. PATENT DOCUMENTS

2009/0302716 A1\* 12/2009 Ohara .................. H01L 41/047
310/363
2010/0254547 A1\* 10/2010 Grosh ................... H04R 17/00
381/114

\* cited by examiner

*Primary Examiner* — Matthew A Eason

(57) ABSTRACT

A MEMS resonator is described.

7 Claims, 3 Drawing Sheets

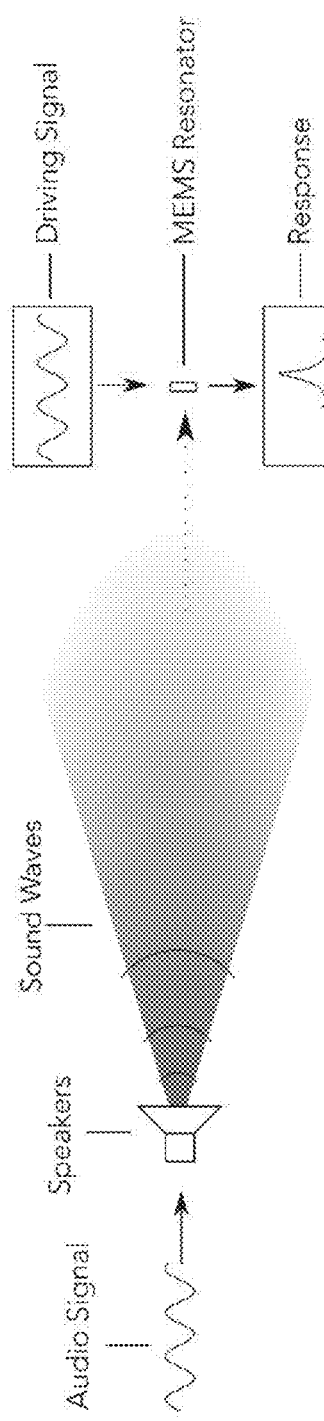
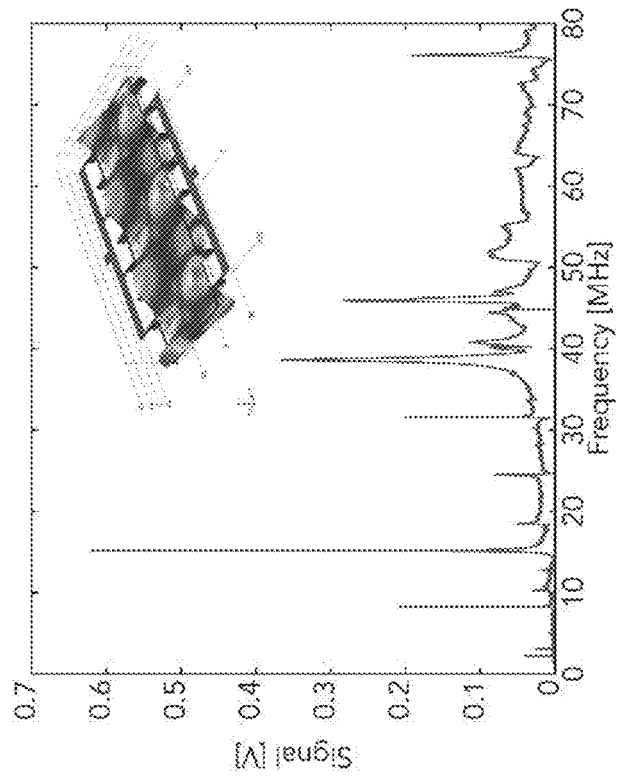
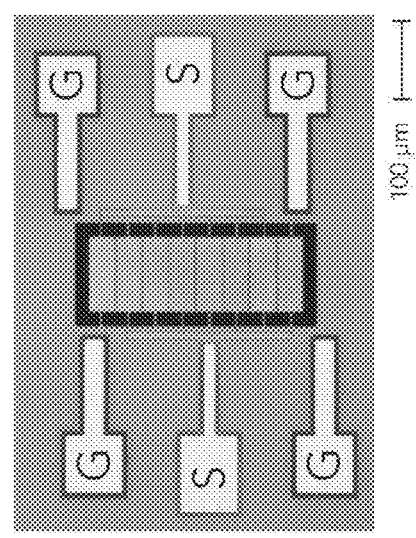
Figure 1 (a)
Figure 1 (b)
Figure 1 (c)

MICROMECHANICAL DEVICE AND RELATED METHODS

RELATED APPLICATIONS

This application claims priority to U.S. Provisional Application No. 62/548,665, filed Aug. 22, 2017, which is incorporated herein by reference in its entirety.

BACKGROUND

The first microphone was invented and patented by Emile Berliner in the late nineteenth century. Since then, microphone diaphragm sizes have shrunken to astounding sizes and continue to shrink. One constant motivation for the size reduction is to fit more functionality into modem smartphones and other smart devices while maintaining a small form factor; however, smaller devices are not without their drawbacks. Namely, the size of the sensor largely controls the signal-to-noise ratio in such devices, which can dramatically impact the usability of devices such as hearing aids and acoustic sensors and microphone for consumer electronics that require small footprint.

Countless microphone types for applications ranging from voice recording to medical ultrasound have been realized, each requiring its own special design. As recently as 2009, a new type of laser-based microphone, which measures the vibrations of particulates suspended in air, was patented. However, this technology is cumbersome and expensive. For practical applications, piezoelectric micromechanical (MEMS) microphones have become an area of intense interest. Microfabricated MEMS microphones can be produced with astoundingly small form factors and be built directly into semiconductor chips.

BRIEF DESCRIPTION OF DRAWINGS

FIG. 1(a) shows an experimental setup including a piezoelectric MEMS resonator that is electrically driven using a signal generator and its response is measured using a spectrum analyzer. At the same time, an audio signal is provided to the speakers, and the sound wave they produce is incident on the resonator.

FIG. 1(b) shows micrograph of the resonator used for this experiment including electrodes marked "S" used for driving or measuring the response of the resonator and electrodes marked "G" used to access the grounding plane.

FIG. 1(c) shows frequency spectrum of resonator the resonator when driven at 19 dBm in the range 1 to 80 MHz. The inset is the modeshape of the 15.168 MHz mode as generated by COMSOL.

DESCRIPTION

Figure 2:
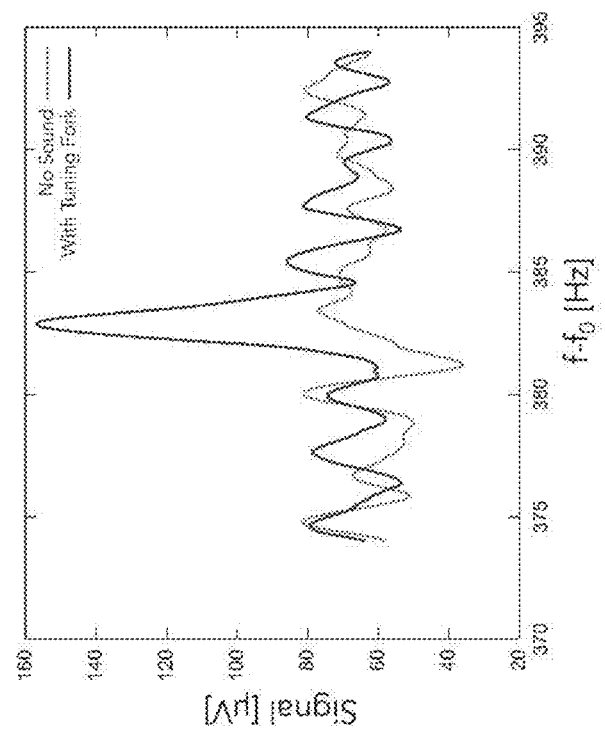
FIG. 2(a) shows response of resonator when driving with power 19 dBm at 15.168 MHz. The pink line was recorded with only ambient noise present, and the blue line was recorded while the speaker was producing a 200 Hz audio tone.
FIG. 2(b) shows response of resonator in range 374 to 394 Hz above resonance when driving with power 19 dBm at 15.168 MHz. The lower line was recorded with only ambient noise present, and the upper line was recorded while a musical tuning fork was making sound. This data was collected to rule out electronic noise as the source of the produced sideband.
Figure 2:
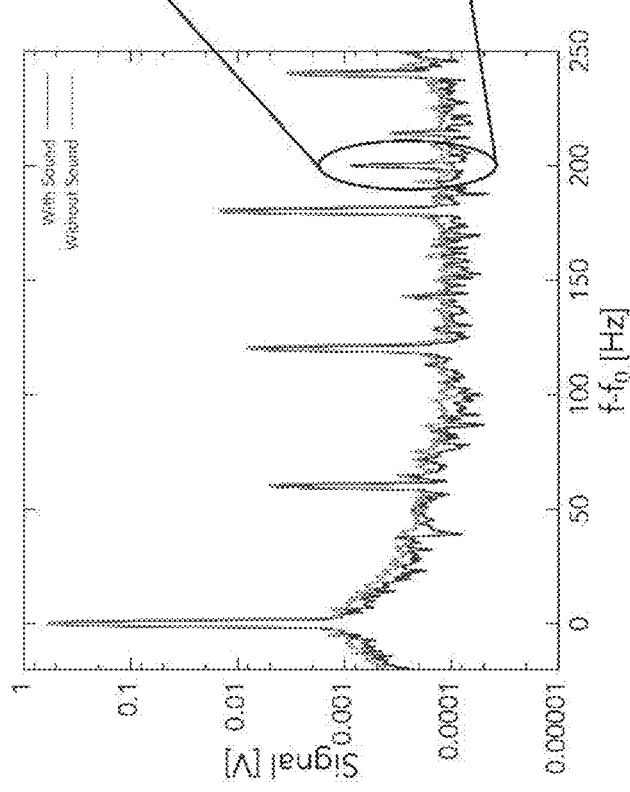

Here, by taking advantage of the frequency-mixing properties of nonlinear MEMS resonators constructed from a combination of silicon structure and aluminum nitride active material, we describe successful and reliable detection of sound waves using a device with a top surface area of only $2.6 \times 10^{-8}$ m$^2$. Sound intensity levels as low as 54 dBA were detectable using this device. Our setup can be used to produce a microphone with sensitivity comparable to current state-of-the-art devices.

It is possible to transmit information by applying a small, off-resonance, time-varying force to a nonlinear mechanical resonator that is being strongly driven at one of its resonance frequencies. In our previous work, we demonstrated this using optical radiation pressure in vacuum. This had the advantage of increasing the quality factor of the resonator by removing losses due to air.

Here, we describe the results of a similar experiment that uses acoustic pressure waves as the small signal rather than modulated optical radiation pressure. In contrast to the previous experiment, the acoustic pressure wave inherently requires a medium for propagation. Despite the much higher damping and lower quality factor that is present when the resonator is exposed to air, we were able to consistently detect sound waves with ultra high sensitivity.

A nonlinear response for a single vibration mode of the resonators in this setup can be modeled using the equation $$m\ddot{x} + \gamma \dot{x} + kx + k_3 x^3 = A_r \cos(2\pi f_r t) + A_m \cos(2\pi f_m t) \quad (1)$$

where m is the effective modal mass, $\gamma$ is the linear damping factor, k is the effective modal spring constant, $k_3$ is the cubic nonlinear spring constant, $A_r$ is the resonance driving amplitude, $A_m$ is the driving amplitude produced by the sound waves, $f_r$ is resonance frequency, t is time, and $f_m$ is the frequency of the sound wave. In this experiment, $A_m$ is proportional to PA, where P is the amplitude of the pressure wave and A is the effective modal area of the resonance mode. The pressure wave used in this basic analysis is also known as the Langevin (rather than Rayleigh) acoustic radiation pressure, which is the average difference between the force per area applied to the front surface of the device and the ambient pressure at the back surface. More recently, it has been shown that Rayleigh acoustic radiation pressure is the acoustic radiation pressure that acts on a moving surface, while the Langevin radiation pressure acts on a stationary surface. In this experiment, the vibrational frequency of the resonator is orders of magnitude larger than the acoustic frequency, so the resonator is at rest on average over the period of the acoustic wave. The amplitude of mechanical oscillation is also negligible. For both of these reasons, the resonator can be treated as being stationary.

A solution to equation (1) can be written as $$x(t) \approx c_r \cos(2\pi f_r t) + c_m \cos(2\pi f_m t) + \Sigma_n c_3(n) \cos(2\pi (f_r \pm n f_m) t), \quad (2)$$

where $c_r$, $c_m$, and $c_3$ are response amplitudes and n is a positive integer. In the absence of nonlinearity, $c_3(n)$ is zero for all n. Frequency and amplitude information contained within the modulation signal can be decoded by demodulating the sidebands at frequencies $f_r \pm nf_m$. For convenience, we use the first-order upper sideband, which is located at the frequency $f_r+f_m$, in this experiment.

As illustrated in FIG. 1(a), we electrically drive a piezoelectric MEMS resonator at resonance using a signal generator at 19 dBm. An audio speaker is placed at a fixed distance from the resonator and provided a signal at a single frequency, typically 200 Hz. The resonator's response is amplified, then measured using a spectrum analyzer. As shown in the micrograph in FIG. 1(b), the resonator is a 270-by-96-µm rectangular plate which is suspended by sixteen 15-by-3-µm legs. From bottom layer to top layer, it is constructed from a 5-µm silicon and 1-µm silicon dioxide structure, a 300-nm molybdenum ground plane, 1-µm aluminum nitride (AlN) piezoelectric layer, and 300-nm interdigitated molybdenum electrodes. Signals can be electrically measured or applied at the electrodes labeled "S", and the electrodes marked "G" provide access to the ground plane. The resonator is directly electrically driven via the inverse piezoelectric effect, where a potential applied across the AlN causes a strain in the layer. The response is measured via the direct piezoelectric effect, where a strain in the resonator produces a potential between the molybdenum layers.

The resonator contains a number of resonant modes in the frequency range of 1 to 80 MHz, as shown in FIG. 1(c), the most prominent one being the 15.168 MHz mode. The mode shape, generated using COMSOL Multiphysics, is shown in the inset of FIG. 1(c). This resonance mode is used for the remainder of the experiment.

Next, we drove the resonator at 15.168 MHz and measured its response, shown by the pink line in FIG. 2(a). The resonance peak is the furthest to the left, and the other peaks are primarily due to 60 Hz noise sources and internal instrument noise. The x-axis shows the frequency relative to the driving frequency. We then turned on the speaker and measured the resonance again, shown in FIG. 2(a). With the speaker turned on, a prominent peak appeared at 15.1682 MHz, 200 Hz above the driving frequency. The magnified oval on the plot shows that, with the speaker turned off, there is no peak present at that frequency.

As evident from the large number of peaks in FIG. 2(a), electronic noise is also a potential source that can produce sidebands. To rule out electronic noise as the source of the sideband observed during the 200 Hz speaker experiment, we used a 384 Hz mechanical tuning fork (such as those used for tuning musical instruments) to produce a sideband 384 Hz above resonance, as shown in FIG. 2(b). When the tuning fork is making sound, a sideband peak that is approximately 100 µV larger than the background is present. When it is silent, the sideband is not present. The tuning fork has the advantage that it is a purely mechanical source of acoustic waves, so electronic interference is not possible; hence, the sideband must be a result of acoustic pressure waves.

Figure 3:
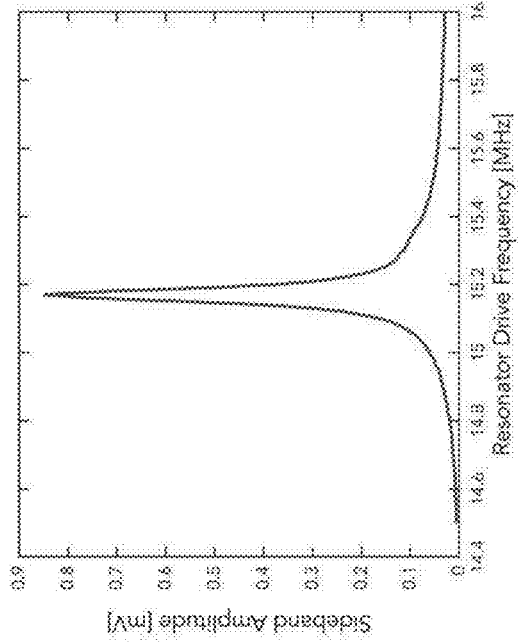
FIG. 3(a) shows response of the resonator between 14.5 and 16.0 MHz when directly driven at various powers.
FIG. 3(b) shows amplitude of the first order upper sideband when the resonator is driven with power 19 dBm between frequencies 14.5 and 16.0 MHz.
FIG. 3(c) shows sideband amplitude as function of the resonator driving power while resonator is driven at 15.168 MHz.
FIG. 3(d) shows resonator size as function of sound intensity. The resonator is driven at constant power 15.168 MHz with power 19 dBm and acoustic wave is applied at randomly generated amplitudes.
Figure 3:
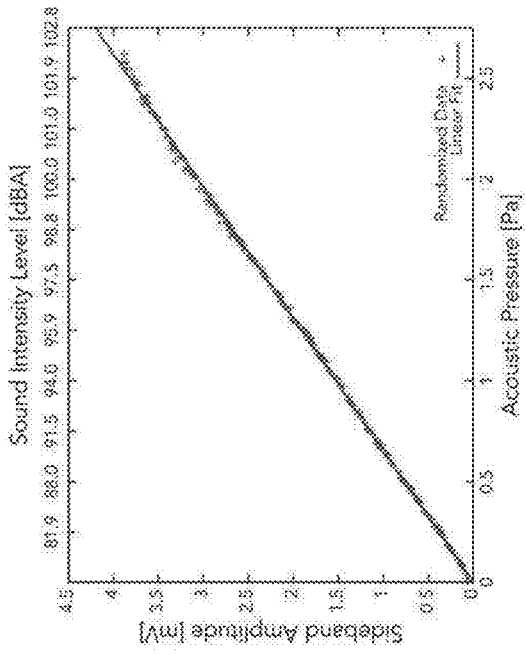
Figure 3:
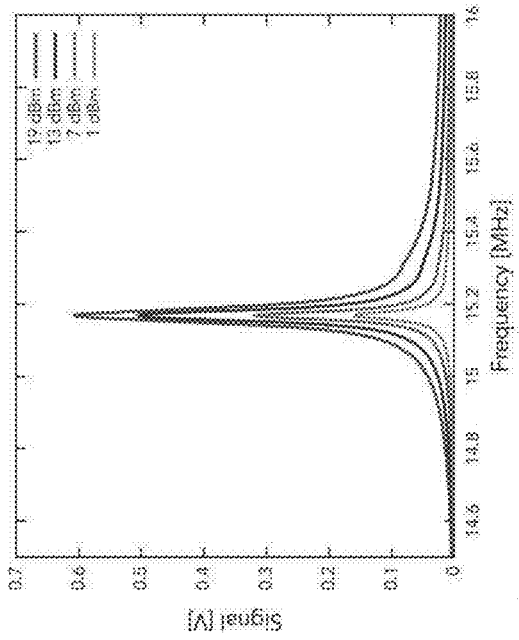
Figure 3:
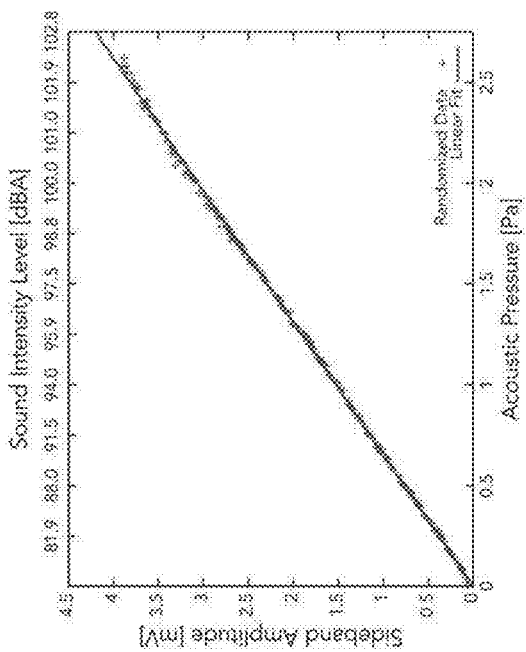

After verifying that the sideband was indeed a result of the sound produced by the speaker, we further characterized the resonator and the sideband for various operational parameters. FIG. 3(a) shows the shape of the resonance peak as a function of frequency and for several different driving powers. Next, we measured the size of the first-order upper sideband as a function of driving frequency, FIG. 3(b). For this plot, a 200-Hz sound wave was continuously incident on the resonator, and the sideband amplitude was measured as the frequency of the 19-dBm signal provided to one of the "S" terminals was varied. By comparing FIGS. 3(a) and 3(b), it is clear that the sideband amplitude is directly related to the resonant response amplitude of the resonator, as expected.

Furthermore, we drove the resonator at 15.168 MHz and measured the sideband amplitude while varying the resonator drive power from 19 dBm to Q29 dBm in 3 dBm increments, FIG. 3(c). Once again, this demonstrated that the sideband amplitude is directly proportional to the resonance response amplitude. Finally, we measured the dependence of the sideband amplitude on the sound level intensity, FIG. 3(d). For this measurement, an acoustic wave with RMS pressure between 0 and 2.7 Pa was produced by the speakers. The sound level intensity was calibrated using a standard sound level meter. As shown in FIG. 3(d), the sideband amplitude is directly proportional to the amplitude of the pressure wave applied, and hence the size of the force applied by the acoustic wave. This linearity is consistent with our predictions and with results of previous published works. Using this data, we find that, including our preamplifier, these devices can be used as microphones with a sensitivity of 1.53 mV/Pa. Without signal amplification, the sensitivity is 23.9 µV/Pa. For the data in FIG. 3(a), the spectrum analyzer was set to a bandwidth of 9.1 kHz and set to hold its maximum value. For the remaining subfigures, the spectrum analyzer was set to a bandwidth of 2 Hz and averaged 10 times for each measurement.

Recently, a design for an AlN-based MEMS microphone was demonstrated to have a sensitivity comparable to the results presented in this paper. However, unlike the previously published results, our microphone takes advantage of the nonlinear nature of MEMS resonators. While other state-of-the-art microphones have been shown to have sensitivities in the range of 200 µV/Pa, they have not taken advantage of the mode-mixing properties of nonlinear MEMS devices. The sensitivity produced by our method can be further improved by using improved or specially-designed resonator shapes.

It is important to note that the resonator design and equipment used for this demonstration are intended only as a proof-of-concept; the resonators have not been optimized for this application, nor has the measurement equipment used been miniaturized. Future work in this project includes optimizing the design for both increased sensitivity and signal-to-noise ratios. Further, we acknowledge that operation in the nonlinear regime has the marked disadvantage of increased power consumption. For instance, throughout this experiment, we used a power of 79 mW to drive the resonator. Resonators which may operate in their linear regimes require only tens or hundreds of microWatts.

In conclusion, we have shown that a piezoelectric MEMS resonator can easily be driven strongly enough in air to display nonlinear behavior, which can be used to detect audio signals as small as 54 dBA with an effective diaphragm size as small as $2.6 \times 10^{-8}$ m$^2$. The sensitivity of this device was further shown to be 23.9 µV/Pa, or −92.4 dBV. This is just one of countless piezoelectric MEMS resonator designs that may be used for such an application. Designs that produce large resonance signals when deformed along the wave's propagation direction should produce the most sensitive microphones. For practical applications such as audio microphones and hearing aids, similar resonators may be arrayed and used in conjunction with modem demodulation methods to rival commercially-available state-of-the-art microphones.

The invention claimed is:

1. A piezoelectric MEMS resonator comprising:
   a first layer comprising molybdenum;
   a second layer disposed above the first layer, the second layer comprising an aluminum nitride piezoelectric layer;
   a set of molybdenum electrodes disposed above the second layer, wherein the set of molybdenum electrodes comprises a set of interdigitated molybdenum electrodes;
   a silicon dioxide structure, wherein the first layer is disposed above the silicon dioxide structure; and
   a silicon layer, wherein the silicon dioxide structure is disposed above the silicon layer.

2. The piezoelectric MEMS resonator of claim 1, wherein the set of interdigitated molybdenum electrodes comprises:
   a first set of electrodes for measuring or applying signals; and
   a second set of electrodes that provide access to a ground plane.

3. The piezoelectric MEMS resonator of claim 1, wherein the piezoelectric MEMS resonator is configured such that:
   a potential applied across the second layer causes a strain in the second layer; and
   the strain produces a potential between the first layer and the set of interdigitated molybdenum electrodes.

4. The piezoelectric MEMS resonator of claim 1, wherein the piezoelectric MEMS resonator comprises a rectangular plate.

5. The piezoelectric MEMS resonator of claim 4, wherein the rectangular plate is suspended by a set of legs.

6. The piezoelectric MEMS resonator of claim 5, wherein the set of legs comprises sixteen legs.

7. The piezoelectric MEMS resonator of claim 1, wherein the piezoelectric MEMS resonator is configured to display nonlinear behavior and to detect audio signals as small as 54 dBA.

* * * * *